United States Patent [19]

Tominaga et al.

[11] Patent Number: 5,311,041
[45] Date of Patent: May 10, 1994

[54] THIN FILM TRANSISTOR HAVING AN INVERTED STAGGER TYPE STRUCTURE

[75] Inventors: Takayuki Tominaga, Chiryu; Nobuyoshi Sakakibara, Kariya; Yuji Hasebe, Nagoya; Tadashi Hattori, Okazaki, all of

[73] Assignee: Nippondenso Co., Ltd., Kariya, Japan

[21] Appl. No.: 846,047

[22] Filed: Mar. 5, 1992

[30] Foreign Application Priority Data

Mar. 8, 1991 [JP] Japan .................. 3-043732

[51] Int. Cl.⁵ .................. H01L 27/01; H01L 27/13; H01L 29/78
[52] U.S. Cl. .................. 257/66; 257/352; 257/354
[58] Field of Search .................. 257/67, 57, 347, 352, 257/353, 354, 66

[56] References Cited

U.S. PATENT DOCUMENTS 4,748,485  5/1988  Vasudev .................. 257/353
5,196,912  3/1993  Matsumoto et al. .................. 257/66

FOREIGN PATENT DOCUMENTS 0301571  2/1989  European Pat. Off. .
59-65479  4/1984  Japan .
191468  4/1989  Japan .

OTHER PUBLICATIONS

Japanese Journal of Applied Physics, vol. 28, No. 11, Nov. 1989, pp. 2197–2200, Kouichi Hiranaka et al Effects of the Deposition Sequence on Amorphous Silicon Thin-Film Transistors.

*Primary Examiner*—Ngan Ngo
*Attorney, Agent, or Firm*—Cushman, Darby & Cushman

[57] ABSTRACT

A thin film transistor having an inverted stagger type structure is formed on a substrate. A gate film having a gate electrode portion is formed on the substrate. A gate insulating film is formed on the gate electrode portion of the gate film such that the gate insulating film is located entirely inside a perimeter defied by the outer edges of the gate electrode portion. A polycrystalline semiconductor film, which is an active layer of the transistor, is formed on the gate insulating film such that it is entirely inside a perimeter defined by the outer edges of the gate insulating layer. The polycrystalline semiconductor film, gate insulating film and gate film are selectively photoetched after being formed on the substrate. Source and drain electrode films are formed so that the electrode films electrically connect with the polycrystalline semiconductor film.

8 Claims, 7 Drawing Sheets

THIN FILM TRANSISTOR HAVING AN INVERTED STAGGER TYPE STRUCTURE

BACKGROUND OF THE INVENTION

1. Field of the invention

The present invention relates to a thin film transistor(TFT) with an inverted stagger type structure, and further, to a method of manufacturing such a transistor. The transistor is utilized as a switching device of an active matrix LCD(Liquid Crystal Display) for example and has a polycrystalline semiconductor layer as an active layer.

2. Description of the Related Art

A conventional thin film transistor has an amorphous silicon layer as the active layer. Carrier mobility of polycrystalline silicon is higher than that of amorphous silicon. Use of a polycrystalline silicon layer as the active layer has been recently examined to improve performance of the transistor.

A glass substrate is exposed to an atmosphere of approximately 300° C. to form the amorphous silicon layer on it. The glass substrate is also exposed to an atmosphere of approximately 600° C. to form the polycrystalline silicon layer on it. For example, the polycrystalline silicon layer may be directly accumulated on the glass substrate by an LPCVD (Low Pressure Chemical Vapor Deposition) method at 600° C., or formed by solid-phase crystallizing amorphous silicon at 600° C. for twenty hours. A hard glass substrate which contains no alkaline metal has been utilized as the glass substrate because of its low price. When the hard glass substrate which contains no alkaline metal is exposed to an atmosphere of more than 550° C., it begins to shrink. Therefore, when the polycrystalline silicon layer is formed on the hard glass substrate which contains no alkaline metal, the hard glass substrate shrinks. In this case, the size of a pattern existing on the hard glass substrate after the polycrystalline silicon layer is formed does not correspond to the size of a pattern before the polycrystalline silicon layer is formed because of the shrinkage. Consequently, it is impossible to execute a mask alignment process after the polycrystalline silicon layer is formed. Therefore, it has been difficult to utilize the hard glass substrate.

Several alternatives have been proposed for reducing the problems caused by shrinkage of the hard glass. One of the alternatives is to make the size of the substrate small. Another alternative is to use quartz as the material of the substrate. Yet another alternative is to raise the temperature that the substrate can withstand before shrinking occurs. However, when the size of the substrate is small, it is impossible to enlarge a display area of the active matrix LCD. When material of the substrate is quartz, the price of the substrate becomes high. There has been no substrate suggested to date which can resist shrinking at 600° C.

With regard to the manufacturing process, a thin film transistor structure shown in FIG. 15 has been examined. The structure is of a so-called staggered type in which a gate is disposed over the active layer. A source and a drain are formed at comparatively low temperature in the manufacturing process. Two concrete manufacturing process will be explained below.

A first manufacturing process will be explained with reference to FIGS. 9 and 11-15. FIG. 9 shows a transparent substrate 10. A polycrystalline silicon layer 13 is formed on the transparent substrate 10. A semiconductor layer 15 is formed on the polycrystalline silicon layer 13. The semiconductor layer 15 has a high-concentration of impurities. A metal electrode layer 16 is formed on the semiconductor layer 15. The semiconductor layers 15a and 15b and the metal electrode layers 16a and 16b are formed by selectively photoetching as shown in FIG. 11. The semiconductor layer 15a and the metal electrode layer 16a correspond to a source region. The semiconductor layer 15b and the metal electrode layer 16b consist of a drain region. The polycrystalline silicon layer 13 is then selectively photoetched as shown in FIG. 12. The photoetched layer 13 corresponds to an active region, or a channel region. A gate insulating layer 12 is formed on the transparent substrate 10, the polycrystalline silicon layer 13, and the metal electrode layers 16a and 16b as shown in FIG. 13. A gate electrode 11 is selectively formed on the gate insulating layer 12. A passivation film 14 is then formed on the gate insulating layer 12 and the gate electrode 11 as shown in FIG. 14. Thereafter, contact holes are opened in the gate insulating layer 12 and the passivation film 14. Electrodes 19a and 19b are formed in the contact holes. FIG. 15 shows the normal staggered type thin film transistor manufactured by the above-mentioned process.

A second manufacturing process will be explained with reference to FIGS. 10-15. FIG. 10 shows the polycrystalline silicon layer 13 formed on the transparent substrate 10. A sacrifical layer 17 for a so-called lift-off process is selectively formed on the polycrystalline silicon layer 13. The sacrifical layer 17 is formed on only the region on which the source and drain regions will be not formed. The semiconductor layer 15 and the metal electrode layer 16 are then formed on the polycrystalline silicon layer 13 and the sacrifice layer 17 in this order. The intermediate structure shown in FIG. 11 is formed by lifting off the sacrifical layer 17. The transistor shown in FIG. 15 is formed by carrying out the processes which have been explained above with reference to FIGS. 12-14.

According to the above-mentioned first and second manufacturing process, the polycrystalline silicon layer 13 is formed before the source and drain regions are formed. Therefore, even if the transparent substrate 10 shrinks when the polycrystalline silicon layer 13 is formed, it is possible to execute the mask alignment process for forming the source and drain regions. It is therefore possible to use the hard glass substrate which contains no alkaline metal as the transparent substrate 10.

However, according to the first manufacturing process, when the semiconductor layer 15 is etched, the polycrystalline silicon layer 13 is also etched a little and is damaged. Therefore, characteristics of the manufactured thin film transistor become unstable.

On the other hand, according to the second manufacturing process, because the source and drain regions are formed by the lift-off process, it is difficult to control shapes of edges of the source and drain regions. Therefore, the gate insulating layer 12 formed on the source and drain regions cracks, and gate withstanding voltage becomes low.

SUMMARY OF THE INVENTION

Accordingly, it is an objective of the present invention to provide a thin film transistor having a polycrystalline semiconductor layer as an active layer and a method of manufacturing such a transistor, wherein a substrate on which the polycrystalline semiconductor layer is formed may be a hard glass substrate which contains no alkaline metal.

Another objective of the present invention is to provide a thin film transistor having good characteristics and a method of manufacturing such a transistor.

To accomplish the foregoing and other objects and in accordance with the purpose of the present invention, a thin film transistor according to the present invention includes a substrate which shrinks when it is heated at more than a certain temperature. A gate film having a gate electrode portion is formed on the substrate. A gate insulating film is formed on the gate electrode portion of the gate film such that the gate insulating layer is located entirely inside a perimeter defined by the outer edges of the gate electrode portion. A polycrystalline semiconductor film is formed on the gate insulating film such that the polycrystalline semiconductor film is located entirely inside a perimeter defined by the outer edges of the gate insulating film. The polycrystalline semiconductor layer is an active layer of the transistor. Source and drain electrode film electrically connect with the polycrystalline semiconductor film.

In a method of manufacturing a thin film transistor, a substrate is first prepared. The substrate shrinks when it is heated at more than a certain temperature. A gate layer is then formed on the substrate. A gate insulating layer is then formed on the gate layer. A polycrystalline semiconductor layer is then formed on the gate insulating layer at a temperature higher than the certain temperature. The polycrystalline semiconductor layer is an active layer of the transistor. The polycrystalline semiconductor layer, the gate insulating layer and the gate layer are then selectively photoetched. Source and drain electrodes are then formed so that the electrodes electrically connects with the polycrystalline semiconductor layer.

According to the present invention, the manufactured thin film transistor is of an inverted staggered type. It is noted that "inversely staggered type" means the structure in which the gate layer is disposed under the active layer. The substrate shrinks when the polycrystalline semiconductor layer is formed. However, because the polycrystalline semiconductor layer, the gate insulating layer and the gate layer are photoetched after these layers are formed on the substrate, misalignment of patterns of these layers does not occur. Moreover, a surface of the polycrystalline semiconductor layer and an interface between the active layer and the gate insulating layer are not damaged by the photoetching.

BRIEF DESCRIPTION OF THE DRAWINGS

The features of the present invention that are believed to be novel are set forth with particularity in the appended claims. The invention, together with the objects and advantages thereof, may best be understood by reference to the following description of the presently preferred embodiments together with are accompanying drawings in which:

DESCRIPTION OF THE PREFERRED EMBODIMENTS

The preferred embodiments of the present invention will now be described with reference to the drawings.

Figure 1:
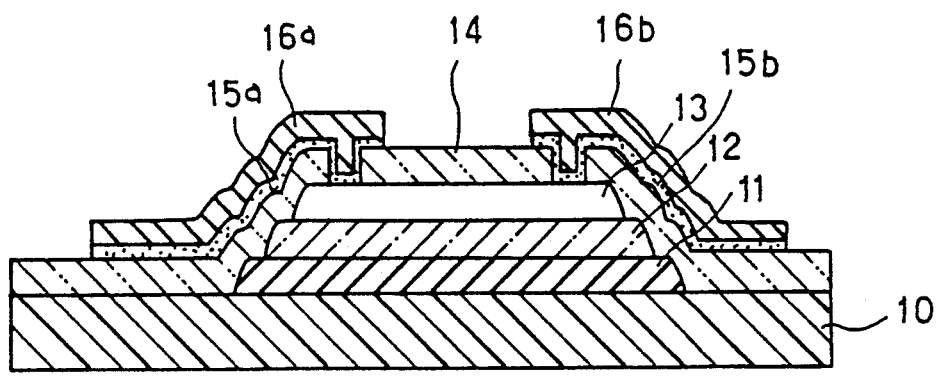
FIG. 1 is a cross-sectional view of a thin film transistor according to a first embodiment.

FIG. 1 shows a cross-sectional view of a thin film transistor according to a first embodiment. The process of manufacturing the transistor will be described with reference to FIGS. 2–6.

Figure 2:
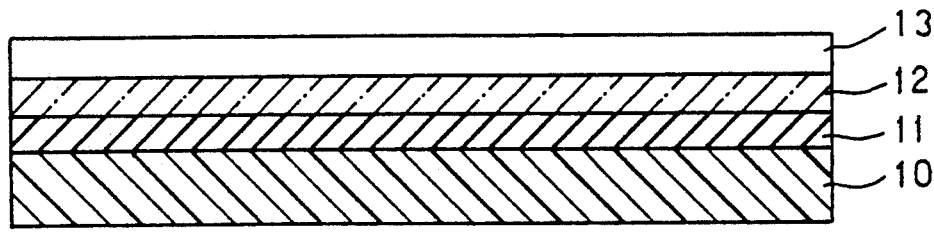
FIGS. 2 to 6 are cross-sectional views explaining the manufacturing process of the thin film transistor shown in FIG. 1.

FIG. 2 shows a hard glass substrate 10 which contains no alkaline metal. The substrate 10 is the transparent type which has been generally used and which shrinks by approximately 160 ppm after it is heated at 600° C. for twenty hours. A chromium (Cr) layer 11 is formed on a whole surface of an upper surface of the substrate 10 by, for example, evaporation while the substrate 10 is heated at 200° C. The chromium layer 11 is utilized as a gate metal layer. A silicon nitride (SiNx) layer 12 is a accumulated on a whole surface of an upper surface of the chromium layer 11 by, for example, a plasma-CVD method while the substrate 10 is heated at 350° C. The silicon nitride layer 12 is utilized as a gate insulating layer. A polycrystalline silicon layer 13 is then accumulated on a whole surface of an upper surface of the silicon nitride layer 12 by heating amorphous silicon at 600° C. for forty hours. The polycrystalline silicon layer 13 is utilized as an active layer. Conductivity type of the layer 13 is, for example, I-type or N-type.

Figure 3:
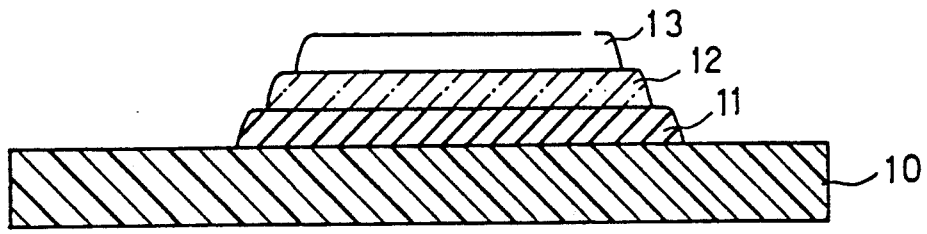

A photoresist layer as an etching resist is screen-printed on a predetermined region of the polycrystalline silicon layer 13. The polycrystalline silicon layer 13 is then selectively etched using a dry-etching process so that the active layer is shaped into a predetermined pattern as shown in FIG. 3. The dry-etching is carried out in a mixed gas of $CF_4$ and $O_2$. The photoresist layer is then stripped. A second photoresist layer is newly screen-printed on the polycrystalline silicon layer 13 and the silicon nitride layer 12 at the circumference of the layer 13. The silicon nitride layer 12 is then selectively etched by dry-etching so that the gate insulating layer is shaped into a predetermined pattern. This second dry-etching is carried out in a gas of $CF_4$. The second photoresist layer is then stripped, leaving the area of the silicon nitride layer 12 being larger than that of the polycrystalline silicon layer 13. The active layer is disposed inside the gate insulating layer. A third photoresist layer is newly screen-printed on the polycrystalline silicon layer 13, the silicon nitride layer 12 and the chromium layer 11, at the circumference of the silicon nitride layer 12. The chromium layer 11 is selectively etched by a mixed solution of $HNO_3$, $(NH_4)_2Ce(NO_3)_6$ and $H_2O$ to shape the gate metal layer into a predetermined pattern. The third photoresist layer is stripped. The area of the chromium layer 11 is larger than that of the silicon nitride layer 12. The gate insulating layer is disposed inside the gate metal layer.

Figure 4:
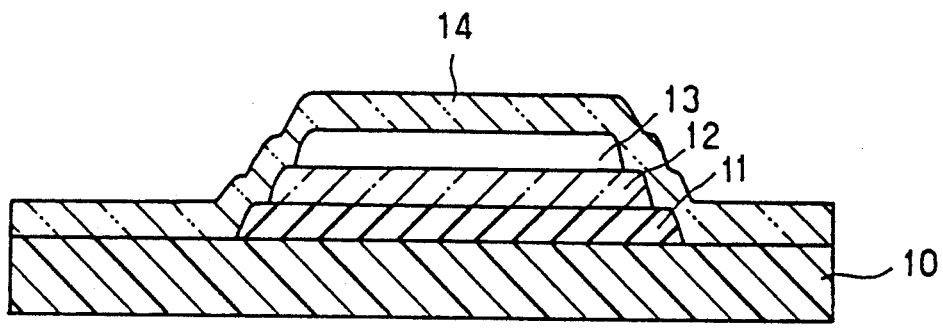

Thereafter, as shown in FIG. 4, a silicon oxide (SiOx) layer 14 is formed on the substrate 10, the chromium layer 11, the silicon nitride layer 12 and the polycrystalline silicon layer 13 by, for example, a plasma-CVD method while the substrate 10 is heated at 350° C. The silicon oxide layer 14 is utilized as a passivation film.

Figure 5:
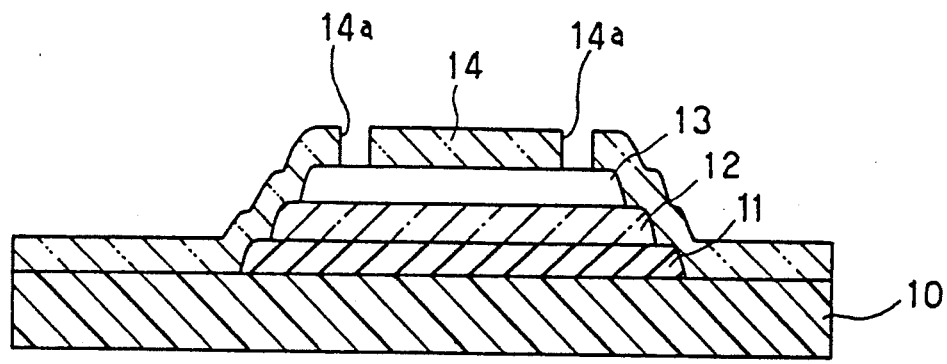

Contact holes 14a are opened in the silicon oxide layer 14 so that portions of the polycrystalline silicon layer 13 are exposed for electrically contacting with source and drain electrodes as shown in FIG. 5.

Figure 6:
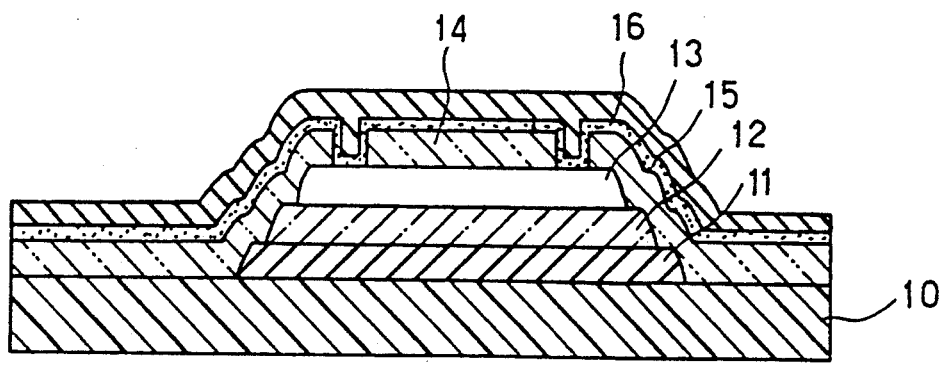

A doped micro-crystalline silicon layer 15 is formed on the polycrystalline silicon layer 13 and the silicon oxide layer 14 by, for example, a plasma-CVD method while the substrate 10 is heated at 200° C. as shown in FIG. 6. The doped micro-crystalline silicon layer 15 has a high-concentration of impurities. An aluminum layer 16 is then formed on the layer 15 by, for example, evaporation while the substrate 10 is heated at 200° C.

Thereafter, the layer 15 and the aluminum layer 16 are selectively photoetched so that doped micro-crystalline silicon layers 15a and 15b and aluminum layers 16a and 16b remain. The source electrode is formed of the layer 15a and the aluminum layer 16a. The drain electrode is formed of the layer 15b and the aluminum layer 16b. Thin film transistor manufactured by the above-mentioned process is of an inversely staggered type.

According to the above-mentioned process, when the polycrystalline silicon layer 13 is formed in the process shown in FIG. 2, the substrate 10 shrinks in accordance with conditions of the process. However, because the chromium layer 11, the silicon nitride layer 12 and the polycrystalline silicon layer 13 are formed on the whole surface of the substrate 10 at this stage, misalignment of patterns does not occur. Therefore, it is possible to reduce the above-mentioned problem on the mask alignment process.

Moreover, while the chromium layer 11 and the silicon nitride layer 12 are etched, the photoresist layer covers the polycrystalline silicon layer 13. Therefore, the surface of the polycrystalline silicon layer 13 as the active layer and an interface between the active layer and the gate insulating layer are not damaged by the photoetching.

Figure 7:
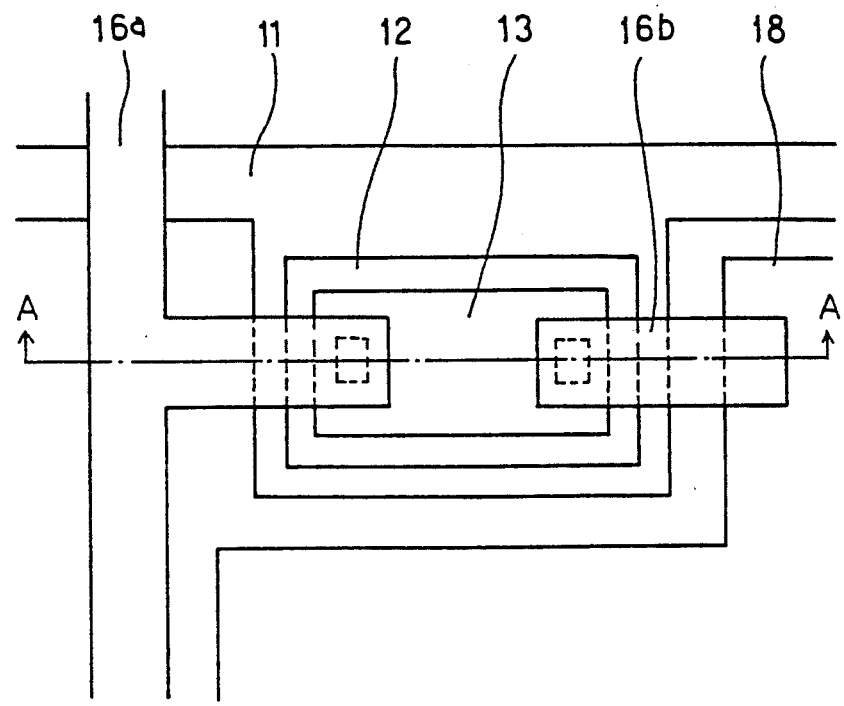
FIG. 7 is a plane view of a thin film transistor utilized in a switching device of an active matrix LCD.
Figure 8:
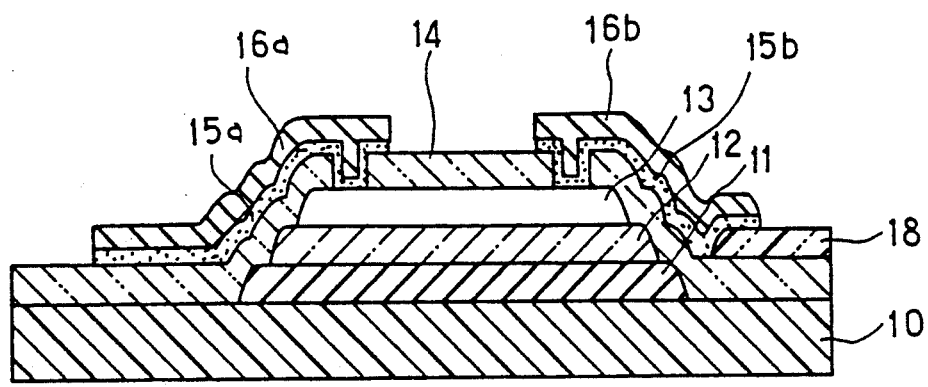
FIG. 8 is a cross-sectional view taken along line A—A of FIG. 7.
Figure 9:
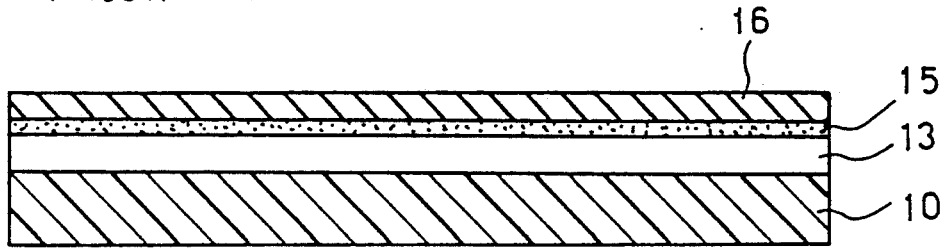
FIGS. 9–14 are cross-sectional views explaining the manufacturing process of a conventional thin film transistor.
Figure 10:
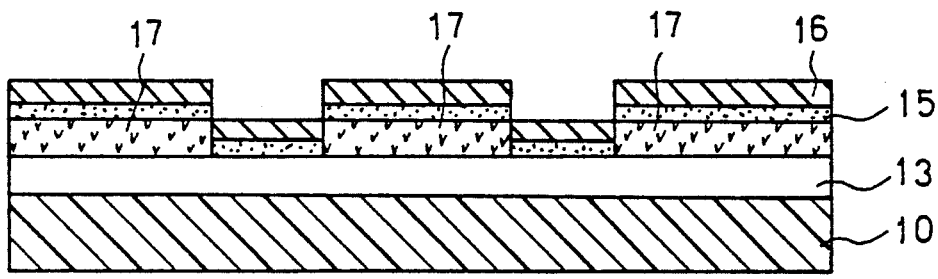
Figure 11:
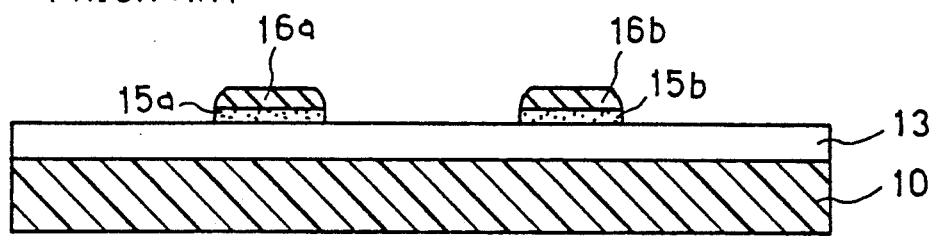
Figure 12:
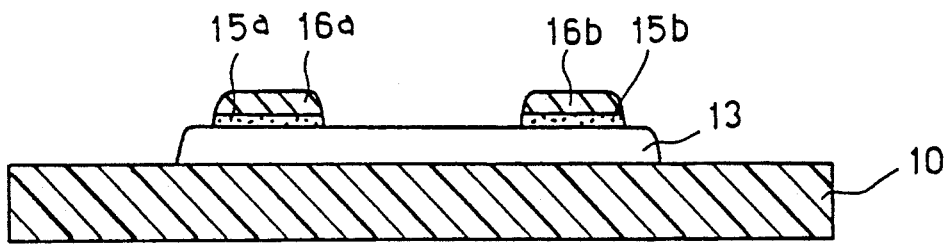
Figure 13:
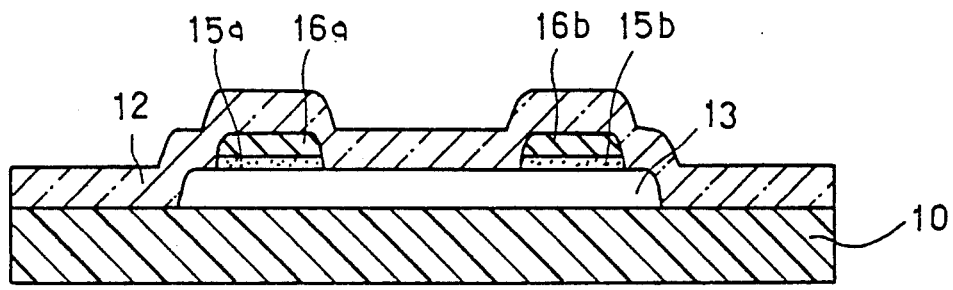
Figure 14:
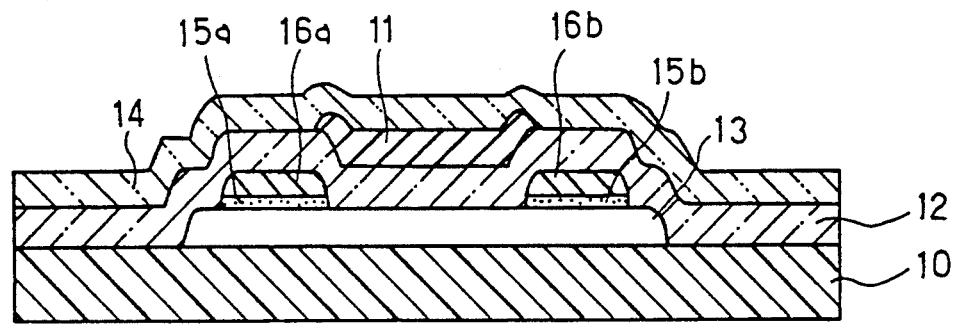
Figure 15:
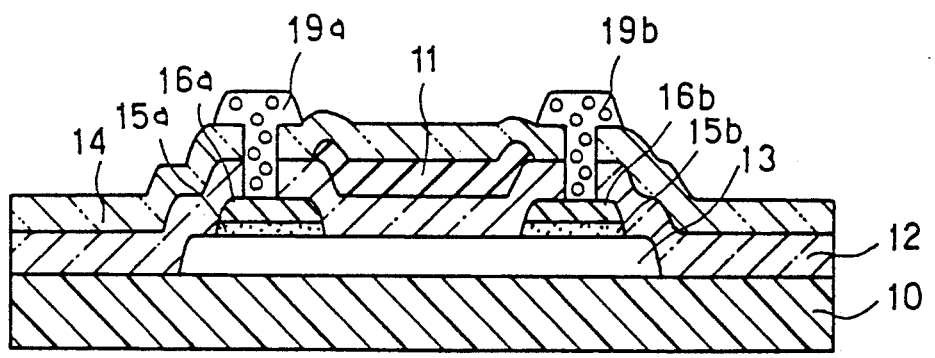
FIG. 15 is a cross-sectional view of the conventional thin film transistor manufactured by the process shown in FIGS. 9–14.

A thin film transistor according to a second embodiment will be described with reference to FIGS. 7 and 8. The transistor is applied to a switching device of an active matrix LCD. FIG. 7 shows the transistor for one picture element and a transparent picture-element electrode layer 18. FIG. 8 shows a cross-sectional view taken along line A—A of FIG. 7.

The process of manufacturing the transistor will be described below. The chromium layer 11, the silicon nitride layer 12, the polycrystalline silicon layer 13 and the silicon oxide layer 14 are first formed on the substrate 10 by the above-mentioned manufacturing process shown in FIGS. 2-4. Thereafter, an ITO (Indium Tin Oxide) layer as the electrode layer 18 is deposited on the silicon oxide layer 14 by a sputtering method while the substrate 10 is heated at 250° C. The ITO is then selectively photoetched as shown in FIG. 8. The contact holes and the source and drain electrodes are formed by the above-mentioned manufacturing process shown in FIGS. 5 and 6. The ITO electrically connects with the drain electrode.

The LCD is driven by controlling electric potential applied to the electrode layer 18 while electric signals are applied to the gate metal layer and the source electrode.

The present invention has been described with reference to the above-mentioned embodiments, but the present invention is not limited to these embodiments and can be modified without departing from the spirit or concept of the present invention, including those enumerated below:

(1) In the above-mentioned embodiments, the polycrystalline silicon layer 13, the silicon nitride layer 12 and the chromium layer 11 have been described as being etched or shaped in a particular order. However, this etching order may be changed.

Figure 16:
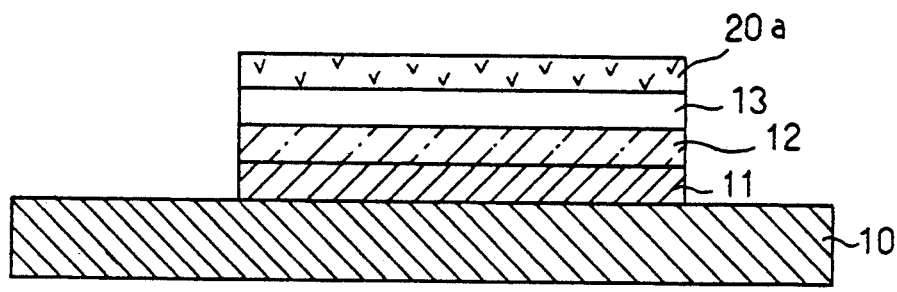
FIGS. 16–18 are cross-sectional views explaining another manufacturing process.
Figure 17:
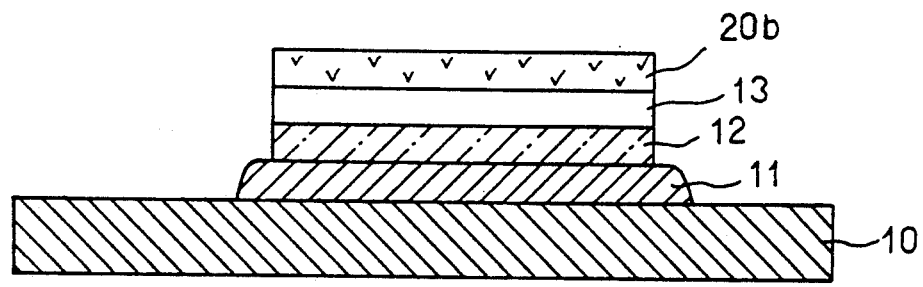
Figure 18:
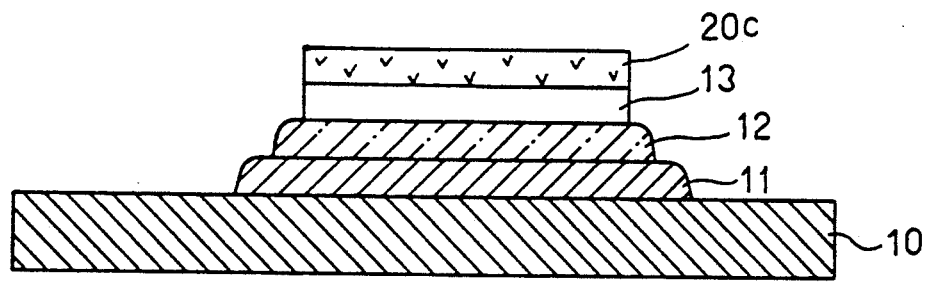

Alternative manufacturing processes will be described with reference to FIGS. 16-18. After the process shown in FIG. 2, a photoresist layer 20a is screen-printed on a predetermined region of the polycrystalline silicon layer 13 as shown in FIG. 16. The polycrystalline silicon layer 13 and the silicon nitride layer 12 are etched by dry-etching using the photoresist layer 20a as an etching mask. The dry-etching is carried out in a mixed gas of $CF_4$ and $O_2$. The chromium layer 11 is then etched by a mixed solution of $HNO_3$, $(NH_4)_2Ce(NO_3)_6$ and $H_2O$. The photoresist layer 20a is stripped.

A photoresist layer 20b is screen-printed on the inside of a surface of the polycrystalline silicon layer 13. The polycrystalline silicon layer 13 and the silicon nitride layer 12 are etched by dry-etching in the mixed gas of $CF_4$ and $O_2$ as shown in FIG. 17. An edge of the chromium layer 11 may be tapered down as the need arises. The photoresist layer 20b is then stripped.

A photoresist layer 20c is screen-printed on the further inside of the surface of the polycrystalline silicon layer 13. The polycrystalline silicon layer 13 is etched by dry-etching in the mixed gas of $CF_4$ and $O_2$ as shown in FIG. 18. The layer 13 may be etched by an alkaline aqueous solution (KOH and so on). The photoresist layer 20c is stripped. Edges of the silicon nitride layer 12 and the polycrystalline silicon layer 13 are tapered down as the need arises. Thus, the structure shown in FIG. 3 is manufactured.

(2) Material of the gate metal layer may be a refractory metal other than chromium, such as molybdenum (Mo), or tungsten(W).

What is claimed is:

1. A thin film transistor with an inverted stagger type structure comprising:
   an insulation substrate;
   a gate film formed on said substrate, said gate film having a gate electrode portion defining a gate electrode of said thin film transistor, said gate electrode portion having outer edges;
   a gate insulating film formed on said gate electrode portion of said gate film such that said gate insulating film is located entirely inside a perimeter defined by said outer edges of said gate electrode portion;
   a polycrystalline semiconductor film active layer formed on said gate insulating film such that said polycrystalline semiconductor film is located entirely inside a perimeter defined by outer edges of said gate insulating film; and
   source and drain electrode films electrically connecting with said polycrystalline semiconductor film.

2. A thin film transistor according to claim 1, wherein said insulation substrate is a transparent substrate.

3. A thin film transistor according to claim 2, wherein said insulation substrate is a hard glass substrate which includes no alkaline metal.

4. A thin film transistor according to claim 1, wherein a material of said gate film includes a refractory metal.

5. A thin film transistor according to claim 1, wherein said polycrystalline semiconductor film is a polycrystalline silicon layer.

6. A thin film transistor according to claim 1, wherein said gate insulating film is a silicon nitride layer.

7. A thin film transistor with an inverted stagger type structure according to claim 1, wherein said gate film includes a gate line portion.

8. A thin film transistor with an inverted stagger type structure according to claim 1, wherein said outer edges of said gate insulating film are spaced from said outer edges of said gate electrode portion of said gate film, and outer edges of said polycrystalline semiconductor film are spaced apart from said outer edges of said gate insulating film.

* * * * *